United States Patent [19]

Tracey et al.

[11] 3,968,384
[45] July 6, 1976

[54] CONSTANT PERCENTAGE CLIPPING CIRCUIT

[75] Inventors: Robert J. Tracey, San Mateo; Ronald J. Violet, Belmont, both of Calif.

[73] Assignee: GTE Automatic Electric Laboratories Incorporated, Northlake, Ill.

[22] Filed: Oct. 21, 1974

[21] Appl. No.: 516,835

[52] U.S. Cl.............................. 307/237; 328/127; 328/171; 307/235 K
[51] Int. Cl.² .......................................... H03K 5/08
[58] Field of Search............ 307/237, 235 K, 235 J; 328/171, 127

[56] References Cited
UNITED STATES PATENTS

| | | | |
|---|---|---|---|
| 3,248,569 | 4/1966 | Weekes............................ | 307/237 |
| 3,259,760 | 7/1966 | Morey et al. .................... | 328/127 X |
| 3,404,348 | 10/1968 | Hansen et al...................... | 307/237 |
| 3,435,253 | 3/1969 | Robinson............................ | 307/237 |
| 3,656,043 | 4/1972 | Kawada et al.................... | 328/171 X |
| 3,660,768 | 5/1972 | Dammann et al. ............. | 307/237 X |
| 3,701,028 | 10/1972 | Markevich....................... | 328/171 X |

Primary Examiner—John S. Heyman
Attorney, Agent, or Firm—Leonard R. Cool; Russell A. Cannon

[57] ABSTRACT

The input waveform is applied via an input resistor to the inverting input of an operational amplifier. The non-inverting input is grounded. In the preferred embodiment, two feedback networks, each comprising a diode and resistor network, are connected between the output and the inverting input of the amplifier. The diodes are oppositely poled. A capacitor is connected to ground at one end and to a charging resistor at the other. The other end of the charging resistor is connected to a junction formed by the resistor and diode in one of the feedback loops. The charging resistor is selected so that the value of the voltage for the reference which is supplied by the voltage across the capacitor C, $e_c$, is of the value to obtain the percentage clipping desired. A discharge resistor is selected so that the capacitor and discharge resistor has a long time constant with respect to the input frequency of the waveform. The ratio of the resistor in the resistor diode feedback path which supplies the charging current to capacitor C to the resistance of the input resistor provides the constant percentage ratio of the clipper.

3 Claims, 6 Drawing Figures ated so that percentage of the waveform is clipped

CONSTANT PERCENTAGE CLIPPING CIRCUIT

BACKGROUND OF THE INVENTION

This invention relates to clipping circuits and more particularly to those circuits in which a portion of a wave is flattened off or limited to some arbitrary level irrespective of the amplitude of the original signal. Further, a floating bias is used in order that the percentage clipping of the waveform may be maintained constant.

DESCRIPTION OF THE PRIOR ART

Clippers have often been classified according to the way in which they operate on a wave. For example, designations commonly used are peak clippers, base clippers, and slicers. It should be further noted that the technique of clipping is also quite commonly called limiting and that the words are often used interchangeably.

A number of limiter applications including the use of diodes and also the use of operational amplifiers is described in the text Operational Amplifiers Design and Applications by J. G. Graeme, G. E. Tobey and Lawrence P. Huelsman, McGraw-Hill Book Co., 1971, at pages 237 – 251. A particular problem with the prior art clipping devices is that a fixed reference voltage is used and any variations in the amplitude of the input waveform changes the ratio of the input signal level to reference voltage level and thus the proportion of the input level clipped is different for any variations in amplitude of the input waveform.

SUMMARY OF THE INVENTION

In a clipping circuit, a floating bias source is derived which is responsive to the amplitude of the input waveform. Variations with time of the input waveform amplitude will change the floating bias so that the same proportion of the waveform is clipped regardless of its amplitude.

DETAILED DESCRIPTION

Figure 1:
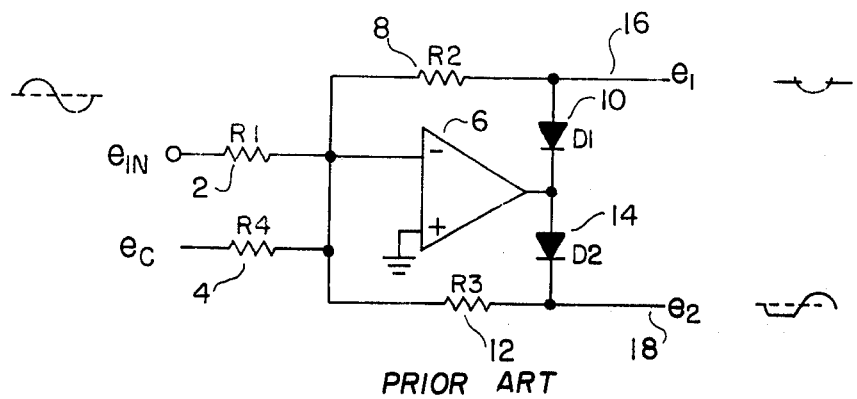
FIG. 1 is a prior art illustration of a clipping circuit which employs a fixed reference potential.

Referring first to FIG. 1, the circuit shown is a prior art method of obtaining an arbitrary clipping level. This is a standard diode clipping arrangement with a reference voltage $e_c$ applied via resistor R4 to the inverting input of operational amplifier 6. The alternating current voltage, $e_{in}$ is applied to the inverting input of amplifier 6 via resistor 2. If the sum of the voltages $e_{in} + e_c$ is greater than 0, then diode 10 is forward biased and the voltage at lead 16 will follow the input inverted. If the sum of the input and reference voltages is less than 0, then diode 14 will be forward biased and the voltage on lead 18 will follow the signal inverted. By varying the value of the reference voltage one can clip or limit the input signal at any given level. The disadvantage of this method as has been specified hereinabove is that both $e_{in}$ and $e_C$ must be well controlled to produce a specified clipping level.

Figure 2:
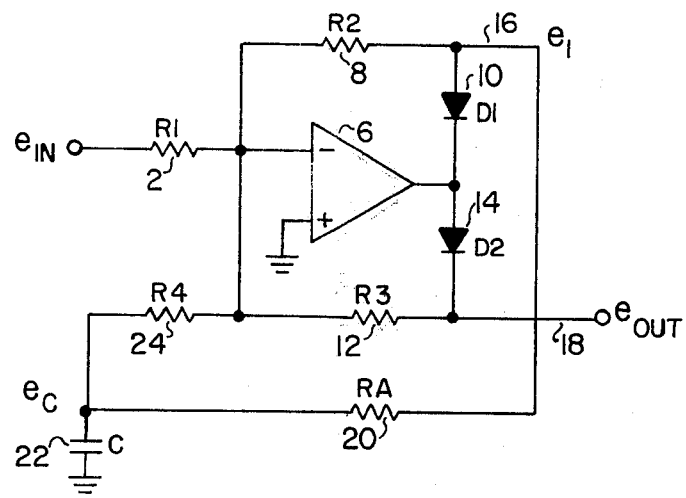
FIG. 2 is an illustration of one embodiment of applicant's invention in which the reference potential is derived from the input amplitude of the waveform.

Referring now to FIG. 2 it may be seen that a reference voltage or "floating bias" is obtained from the input signal by means of capacitor 22. The floating bias voltage is obtained from output 16 via charging resistor 20. A discharge path is provided via resistor 24 to the inverting input of amplifier 6, and resistor 2 to the signal input terminal. The time constant derived from the combination of resistor 24 and capacitor C must be long with respect to the input frequency so that the charge on capacitor 22 will remain constant during the normal operating period. For these conditions a relationship can be established between the voltage on capacitor 22, i.e., reference voltage $e_c$, the voltage at output 16, $e_1$, and the input voltage $e_{in}$. In showing this relationship mathematically the resistance R designations are employed and are those shown on the drawing. Note that the R designations and the numbering designations have been retained consistently throughout all of the drawings.

Equation $e_c = 1/SR_AC \; e_1 = -1/SR_AC \; R_2/R_1 \; e_{in}$ (1)

$e_c/e_{in} = K$ for a given frequency (2)

Figure 3A:
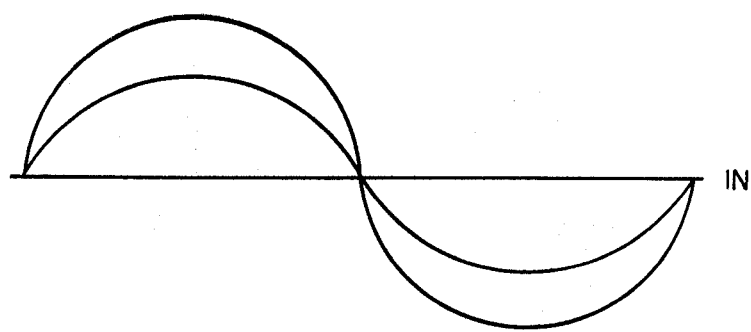
FIG. 3A shows a pair of alternating current waveforms having different amplitudes which would appear at the input to the clipper.
Figure 3B:
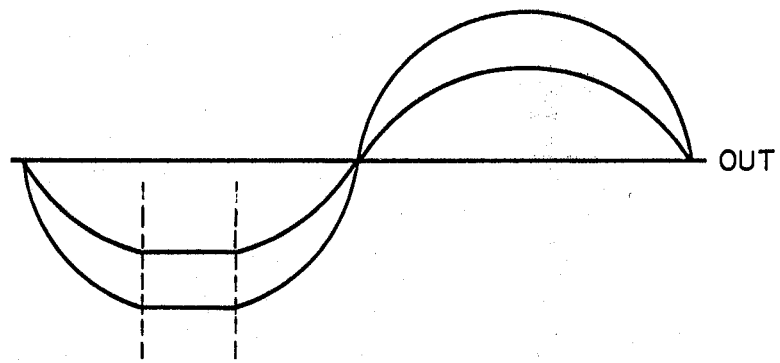
FIG. 3B shows the clipped output for the waveforms of FIG. 3A and illustrates by the dash lines that the ratio or percentage of waveform clipped is constant.

Since the ratio of the reference voltage to the input voltage is a constant, the clipping level will vary with the absolute amplitude of the input voltage to maintain a specified clipping percentage as determined by resistors $R_1$, $R_2$, $R_A$, and capacitor C. This is illustrated diagrammatically in FIG. 3.

Figure 4:
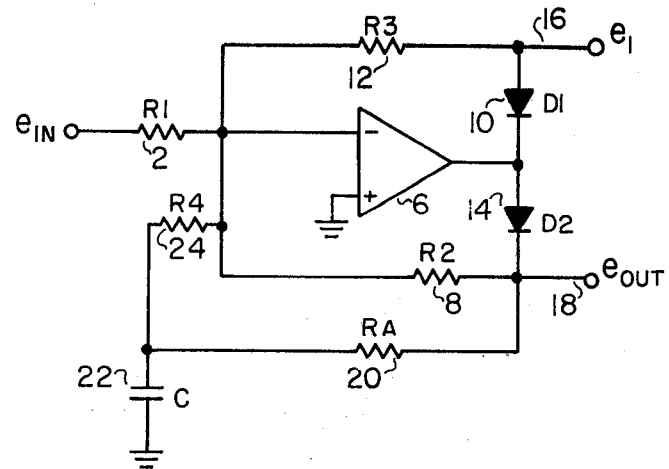
FIG. 4 is another embodiment of applicant's invention using two feedback circuit arrangements but employing the output voltage as the charging voltage for the floating bias circuit.
Figure 5:
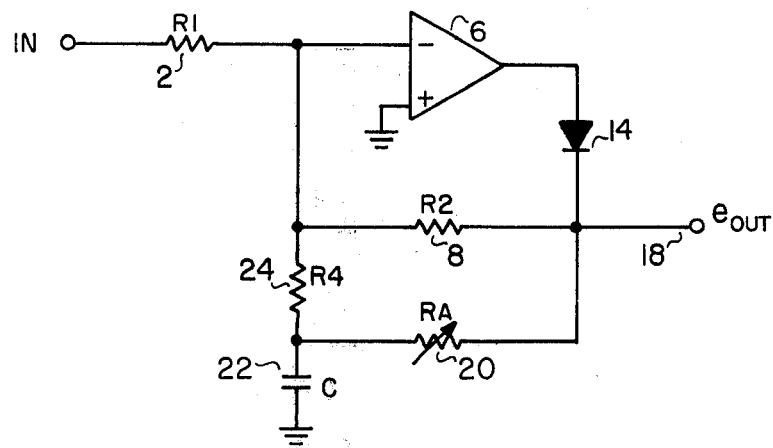
FIG. 5 is another embodiment of applicant's invention in which only one feedback circuit is employed and where the charging current to the floating bias circuit is applied from the output voltage of the clipping circuit.

The circuit shown in FIG. 2 will produce a positive going output, $e_{out}$, which can be clipped up to 50% or a negative going output, $e_1$, which can be clipped 50–100%. In another embodiment shown in FIG. 4, capacitor 22 is charged from diode 14 which is connected to $e_{out}$ and this produces a positive going output, $e_{out}$ which can be clipped 50–100% or a negative going output, $e_1$, which can be clipped up to 50%. Where only the positive or negative going portion of the alternating wave input is to be clipped the embodiment of FIG. 5 may be used. Other circuit arrangements can be devised which do not depart from the spirit of applicants' invention.

What is claimed is:

1. A circuit for clipping an alternating current waveform so that the same percentage of the waveform is clipped regardless of the input amplitude of the waveform, which comprises:

input means;

an operational amplifier having its inverting input connected to the input means and its noninverting input connected to a common reference point;

nonlinear feedback means connected between the output of said operational amplifier and its inverting input, said feedback means comprising:

unilateral conducting means having a plurality of terminals, a first terminal thereof being connected to the output of said operational amplifier; and resistance means having a plurality of terminals, a first terminal thereof being connected to the inverting input of the operational amplifier and a second terminal thereof being connected to a second terminal of said unilateral conducting means;

and floating bias means connected to said input means and said feedback means, said bias means comprising:

a capacitor having one terminal connected to the common reference point;

a first resistor having one terminal connected to the other terminal of said capacitor and the other resistor terminal connected to a junction of the unilateral conducting means and resistance means of said feedback means; and a second resistor having one terminal connected to the other terminal of the capacitor and having the other second resistor terminal connected to the inverting input of said operational amplifier.

2. A circuit in accordance with claim 1 wherein said feedback means further comprises:

a first diode having its cathode connected to the output of said operational amplifier; and a third resistor connected between the inverting input of the operational amplifier and the anode of said first diode.

3. A circuit in accordance with claim 2 wherein said feedback means further comprises:

a second diode having its anode connected to the output of said operational amplifier; and a fourth resistor connected between the cathode of said second diode and the inverting input of said operational amplifier.

* * * * *

UNITED STATES PATENT AND TRADEMARK OFFICE
CERTIFICATE OF CORRECTION

PATENT NO. : 3,968,384
DATED : July 6, 1976
INVENTOR(S) : Robert J. Tracey & Ronald J. Violet It is certified that error appears in the above–identified patent and that said Letters Patent are hereby corrected as shown below:

Column 2, line 34, equation (1) should be changed from

"$e_c \simeq 1/SR_A C\ e_1 = -\ 1/SR_A C\ R_2/R_1\ e_{in}$" to

-- $e_c \approx (1/SR_A C) e_1 = -\ (1/SR_A C)(R_2/R_1) e_{in}$ --.

Signed and Sealed this nineteenth Day of July 1977

[SEAL]

Attest:

RUTH C. MASON
*Attesting Officer*

C. MARSHALL DANN
*Commissioner of Patents and Trademarks*